(12) United States Patent
Lee

(10) Patent No.: US 8,101,519 B2
(45) Date of Patent: Jan. 24, 2012

(54) MOLD, MANUFACTURING METHOD OF MOLD, METHOD FOR FORMING PATTERNS USING MOLD, AND DISPLAY SUBSTRATE AND DISPLAY DEVICE MANUFACTURED BY USING METHOD FOR FORMING PATTERNS

(75) Inventor: Seung-Jun Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 100 days.

(21) Appl. No.: 12/476,737

(22) Filed: Jun. 2, 2009

(65) Prior Publication Data
US 2010/0038649 A1 Feb. 18, 2010

(30) Foreign Application Priority Data

Aug. 14, 2008 (KR) .................. 10-2008-0079799
Nov. 24, 2008 (KR) .................. 10-2008-0116714

(51) Int. Cl.
*H01L 21/44* (2006.01)
*G03F 7/00* (2006.01)
*G03F 7/12* (2006.01)
*G03F 7/26* (2006.01)
*B44B 5/00* (2006.01)

(52) U.S. Cl. ............ 438/669; 257/E21.582; 430/299; 101/28; 101/32; 156/447

(58) Field of Classification Search .......... 438/669; 430/299; 101/28, 32; 156/447; 257/E21.582
See application file for complete search history.

(56) References Cited

U.S. PATENT DOCUMENTS

| 4,764,564 A * | 8/1988 | Schmidt et al. ......... 525/328.2 |
| 7,122,482 B2 | 10/2006 | Xu |
| 7,348,274 B2 * | 3/2008 | Chung et al. ............ 438/679 |
| 7,544,069 B2 * | 6/2009 | Kim ......................... 439/99 |
| 7,753,674 B2 * | 7/2010 | Kim ......................... 425/385 |
| 7,858,014 B2 * | 12/2010 | Chae et al. .............. 264/293 |
| 2002/0127499 A1 * | 9/2002 | Endo et al. ............. 430/327 |
| 2004/0202865 A1 * | 10/2004 | Homola et al. .......... 428/421 |
| 2006/0127522 A1 * | 6/2006 | Chou ...................... 425/150 |
| 2007/0145004 A1 * | 6/2007 | Kim ......................... 216/24 |
| 2007/0275193 A1 * | 11/2007 | DeSimone et al. ...... 428/34.1 |
| 2008/0121612 A1 * | 5/2008 | Nam et al. ................. 216/23 |
| 2009/0304992 A1 * | 12/2009 | Desimone et al. ....... 428/141 |

FOREIGN PATENT DOCUMENTS

| JP | 2005159358 | 6/2005 |
| JP | 2007243181 | 9/2007 |
| JP | 2007329276 | 12/2007 |
| JP | 2008068611 | 3/2008 |
| KR | 100631017 | 9/2006 |
| KR | 100674157 | 1/2007 |
| KR | 1020070082962 | 8/2007 |
| KR | 1020070105040 | 10/2007 |
| KR | 100827620 | 4/2008 |
| KR | 100831046 | 5/2008 |
| KR | 100837806 | 6/2008 |

* cited by examiner

*Primary Examiner* — Evan Pert
(74) *Attorney, Agent, or Firm* — H.C. Park & Associates, PLC

(57) ABSTRACT

The present invention relates to a mold, a manufacturing method of the mold, and a method of forming patterns using the mold. The mold may include a main body having a convex portion and a recess portion, and a polymer layer formed over the main body by processing a surface of the main body with a high molecular weight material through a surface treatment.

21 Claims, 23 Drawing Sheets

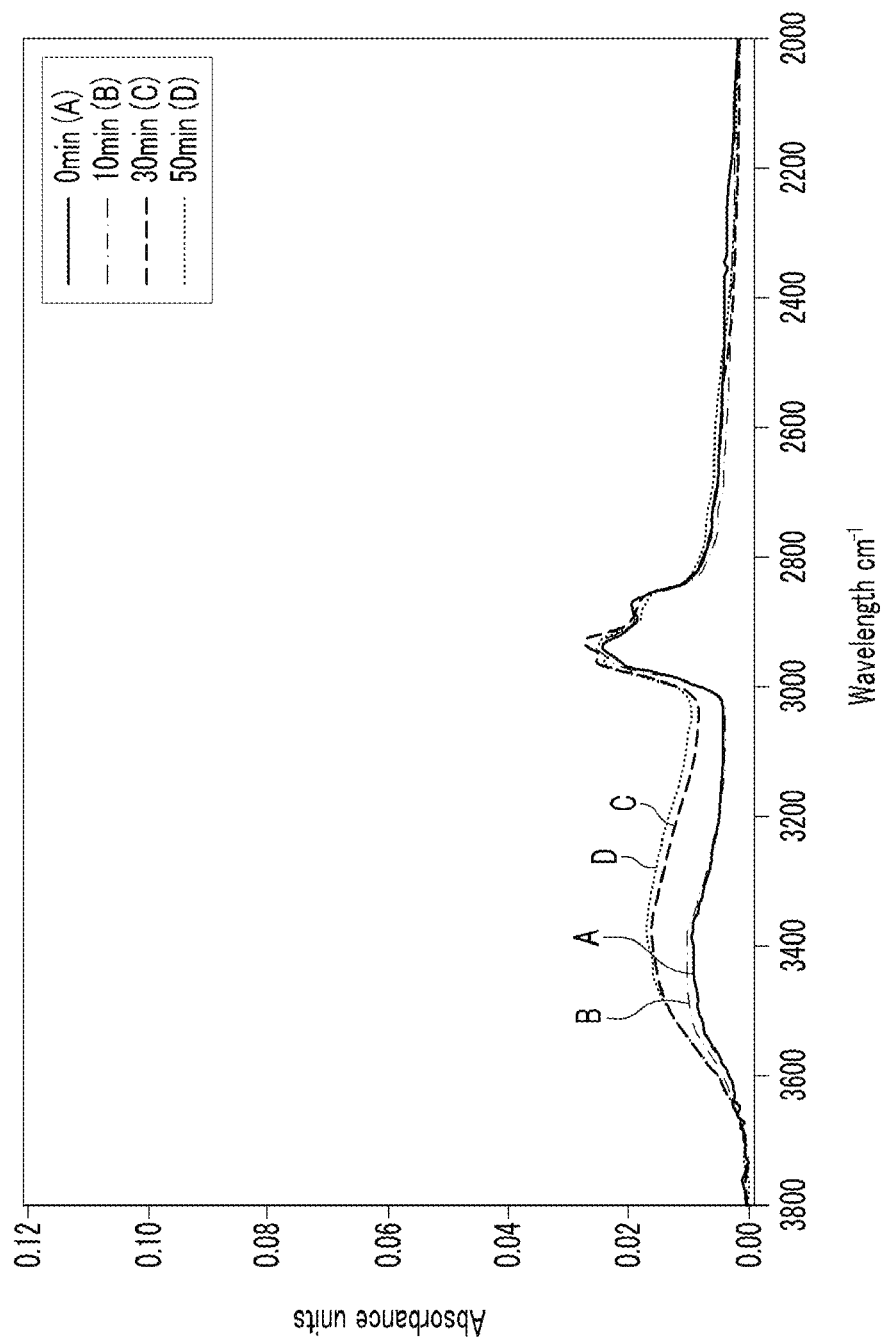

MOLD, MANUFACTURING METHOD OF MOLD, METHOD FOR FORMING PATTERNS USING MOLD, AND DISPLAY SUBSTRATE AND DISPLAY DEVICE MANUFACTURED BY USING METHOD FOR FORMING PATTERNS

CROSS-REFERENCE TO RELATED APPLICATIONS

This application claims priority to and the benefit of Korean Patent Application No. 10-2008-0079799, filed on Aug. 14, 2008, and Korean Patent Application No. 10-2008-0116714, filed on Nov. 24, 2008, which are both hereby incorporated by reference for all purposes as if fully set forth herein.

BACKGROUND OF THE INVENTION

1. Field of the Invention

The present invention relates to a mold, a manufacturing method of the mold, a method for forming patterns using the mold, and a display substrate and a display device manufactured by using the method for forming patterns.

2. Discussion of the Background

A photolithography process has been widely used to form display elements and electronic devices. However, the photolithography process typically requires expensive equipment such as exposure equipment and high-priced masks. The expensive equipment and masks increases initial investment cost and decreases economic benefit. Furthermore, there is a limitation in forming hyperfine patterns using the photolithography process.

In order to overcome the disadvantages of the photolithography process, an imprint lithography technology was introduced. The imprint lithography does not require masks because it forms resist patterns by a process like stamping a seal on a substrate. The imprint lithography process may be used to manufacture hyperfine patterns in quantity with comparatively less cost.

The imprint lithography process forms a resist layer over a substrate and carves a predetermined pattern in the resist layer using a mold having the predetermined pattern. Then, a hardening process is performed through exposure or heat treatment, and a resist pattern is formed by separating the mold from the resist layer. A metal layer where a pattern is formed is etched using the formed resist pattern, and the resist pattern is then removed through a stripping process.

With this process, the mold is separated from the substrate after performing the above described processes. Since the mold may break due to high pressure applied to the process of carving the patterns of the mold at the resist layer or since the mold is closely adhered to the resist layer, the mold may not be properly separated from the resist layer. That is, a part of the resist layer may be left on the surface of the mold. In this case, an additional process is performed to clean the surface of the mold so that the mold may be reused. Also, this shortens the life span of the mold.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention provides a mold, a manufacturing method of the mold, and a method for forming patterns using the mold where a mold may be easily separated from a resist layer after forming a target pattern with less cost and without increasing the number of manufacturing processes.

Additional features of the invention will be set forth in the description which follows, and in part will be apparent from the description, or may be learned by practice of the invention.

The present invention discloses a mold including a main body having a convex portion and a recess portion, and a polymer layer disposed on the convex portion and the recess portion and having a high molecular weight material having an amine group.

The present invention also discloses a mold including a main body having a convex portion and a recess portion, and a polymer layer on the main body and having a hydrophobic property.

The present invention also discloses a method of forming a mold including forming a main body having a convex portion and a recess portion, and processing a surface of the main body with a high molecular weight material containing an amine group.

The present invention also discloses a method of manufacturing a mold including forming a main body including a convex portion and a recess portion, and forming a polymer layer having a hydrophobic property on the main body.

The present invention also discloses a method of forming patterns including coating a pattern forming region on a substrate, forming a resist layer on the pattern forming region, forming a main body of a mold that has a convex portion and a recess portion, performing surface treatment on a surface of the main body having the convex portion and the recess portion, the surface treatment being performed with a high molecular weight material having an amine group, the surface treatment imparting a hydrophobic property to the surface of the main body, disposing the mold over the resist layer, forming a pre-resist pattern having a non-pattern portion and a pattern portion by imprinting the resist layer using the mold, forming a hardened resist pattern by exposing the imprinted pre-resist pattern, separating the mold from the hardened resist pattern, forming a resist pattern by removing the non-pattern portion through ashing the hardened resist pattern, performing heat treatment on the resist pattern, forming a pattern at the pattern forming region by etching the resist pattern, and stripping the resist pattern.

The present invention also discloses a method of forming a pattern, including forming a base layer on a substrate, forming an adherence enhancing layer on the base layer, forming a resist layer on the adherence enhancing layer, preparing a mold by forming a coating layer having a hydrophobic group on a main body having a convex portion and a recess portion, forming a resist pattern using the mold, forming a pattern by etching the base layer using the resist pattern as a mask, and removing the resist pattern.

The present invention also discloses a display device that may include a gate line, a gate insulating layer disposed on the gate line, a semiconductor layer disposed on the gate insulating layer, a data line having a source electrode disposed on the semiconductor layer, a drain electrode facing the source electrode, a passivation layer disposed on the data line and the drain electrode, a pixel electrode disposed on the passivation layer, and an adherence enhancing layer. The adherence enhancing layer has a compound containing a methyl group and is disposed on at least one of the gate line, the gate insulating layer, the semiconductor layer, the data line, the drain electrode, the passivation layer, and the pixel electrode.

The present invention also discloses a display substrate including a base layer disposed on a substrate, and an adherence enhancing layer disposed on the base layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 7 is an FT-IR graph showing state variation of a hydroxyl group introduced onto a surface of a mold according to ozone treatment time during processing of the mode with surface treatment according to an exemplary embodiment of the present invention.

DETAILED DESCRIPTION OF THE ILLUSTRATED EMBODIMENTS

Figure 1:
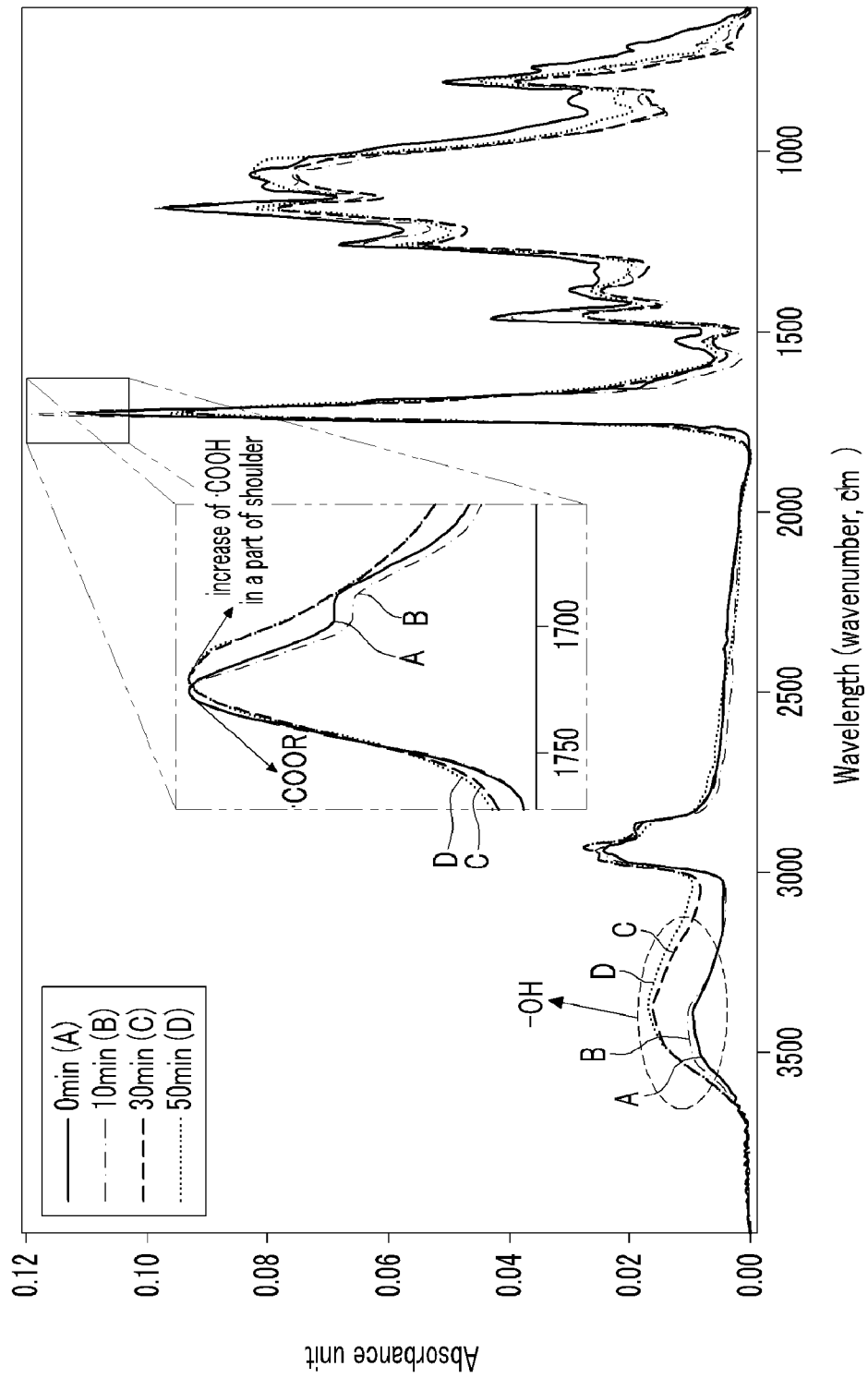
FIG. 1 is an FT-IR graph that shows state variation of a carboxyl group and a hydroxyl group introduced on a surface of a mold according to ozone treatment time during a process of performing surface treatment on a mold used in an imprint device.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

A mold according to an exemplary embodiment of the present invention will be described below with reference to FIG. 5D.

Figure 5A:
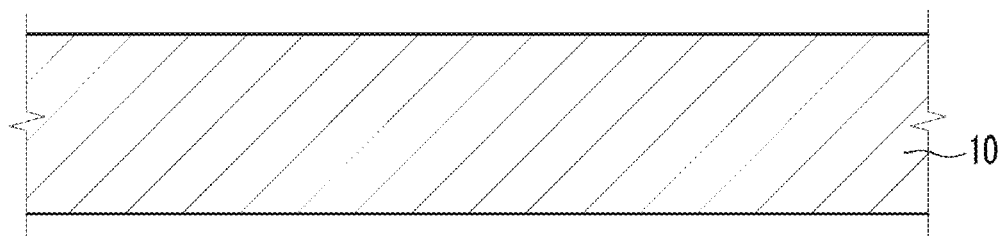
FIG. 5A, FIG. 5B, FIG. 5C, FIG. 5D, FIG. 5E, FIG. 5F, FIG. 5G, FIG. 5H, FIG. 5I, FIG. 5J, and FIG. 5K are cross-sectional views that sequentially show a method of forming patterns using an imprint device according to an exemplary embodiment of the present invention.
Figure 5B:
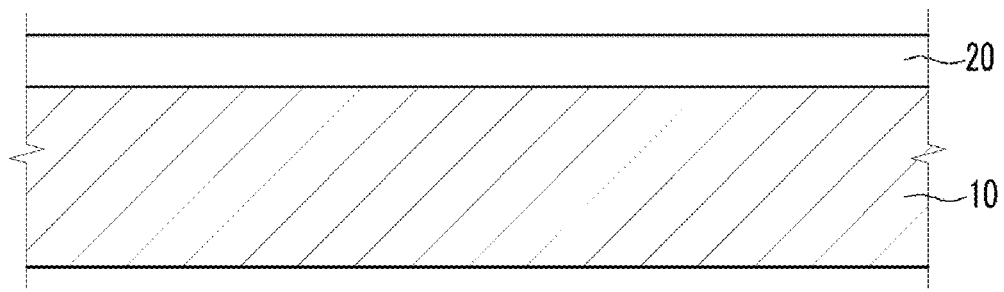
Figure 5C:
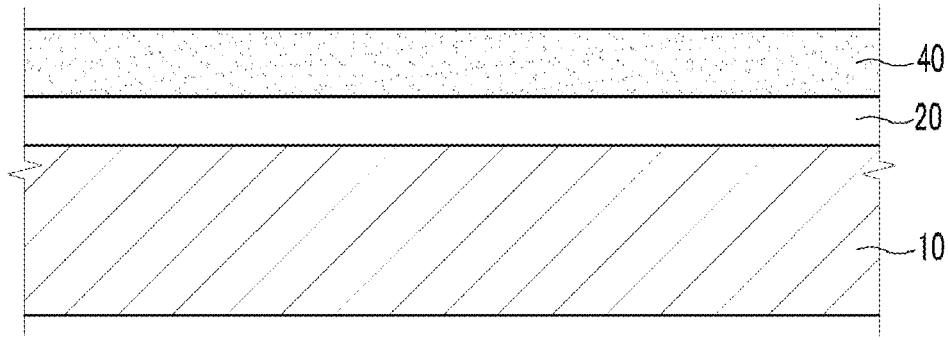
Figure 5D:
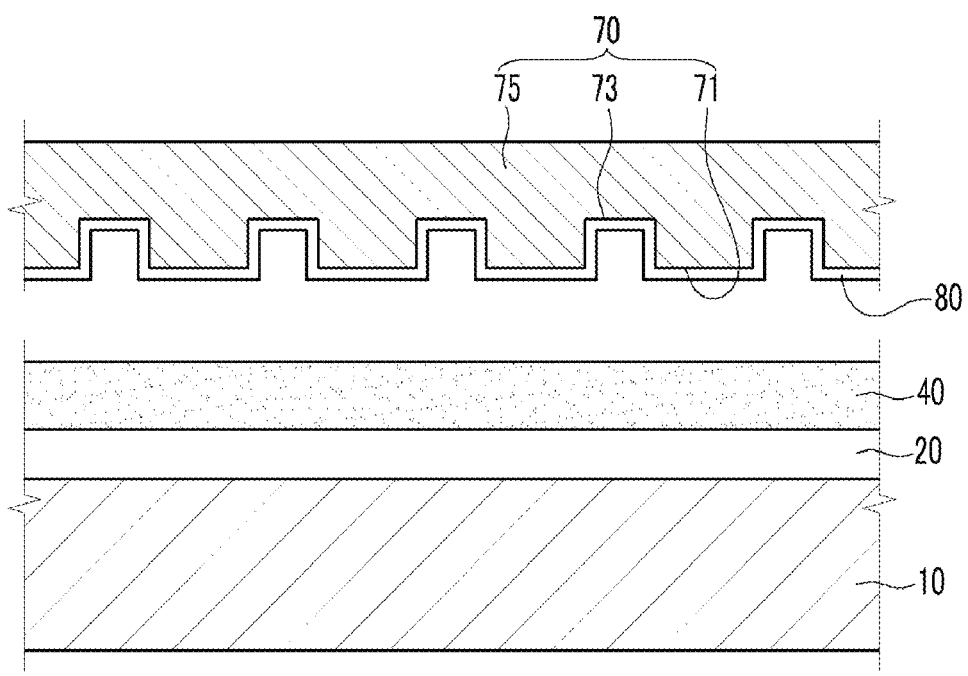

Referring to FIG. 5D, the mold 70 may include a surface having a convex portion 71 and a recess portion 73, a main body 75 formed of a high molecular weight material, and a polymer layer 80 on the main body 75 and having an amine group. Here, the polymer layer 80 may include a polymer/copolymer. The polymer layer 80 may include polydimethylsiloxane-co-aminopropyl methylsiloxane (PDMS-co-APMS).

A hydrophilic group may be introduced onto the convex portion 71 and the recess portion 73 of the mold 70 by ozone treatment. The introduced hydrophilic group may be at least one of a carboxyl group and a hydroxyl group.

The introduction of the hydrophilic group will be described with reference to FIG. 1, which is a Fourier Transform Infrared (FT-IR) graph that shows state variation of the carboxyl group and the hydroxyl group introduced on a surface of a mold 70 according to ozone treatment time.

In a qualitative aspect, a hydroxyl group (—OH) has a characteristic peak that widely spreads out at around wavelengths of 3300-3500 $(cm^{-1})$, and a carboxyl group (—COOH) has a characteristic peak that may be very steep at around wavelengths of 1700-1750 $(cm^{-1})$. In a quantitative aspect, the characteristic peaks of the hydroxyl group (—OH) and the carboxyl group (—COOH), which are absorbance units, increase from a curve (A) of no ozone treatment, a curve (B) of 10 minutes of ozone treatment, a curve (C) of 30 minutes of ozone treatment, to a curve (D) of 50 minutes of ozone treatment. This means that the longer the ozone treatment time is, the more the hydrophilic group such as the hydroxyl group (—OH) and the carboxyl group (—COOH) are introduced on the surface of the mold 70.

The introduction of the hydrophilic group will be described with reference to FIG. 2, which is a graph showing variation of contact angle θ of a surface of the mold 70 according to ozone treatment time.

Figure 2:
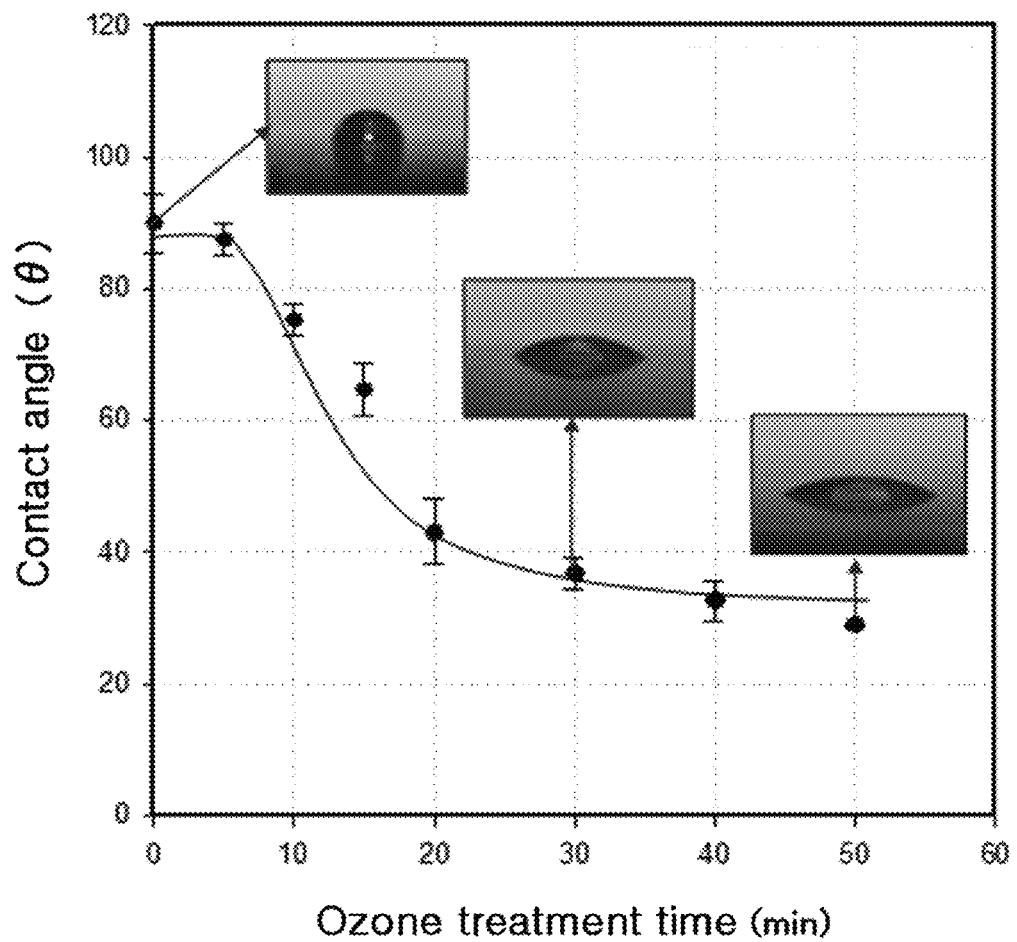
FIG. 2 is a graph that shows variation of contact angles of a surface of a mold according to ozone treatment time during a process of performing a surface treatment on a mold used in an imprint device.

Referring to FIG. 2, in the case of no ozone treatment, the contact angle of the surface of the mold 70 may be about 90°. When ozone treatment time is about 10 minutes, the contact angle becomes about 75°. When ozone treatment time is about 20 minutes, the contact angle becomes about 43°. When ozone treatment time is about 30 minutes, the contact angle becomes about 37°. When ozone treatment time is about 40 minutes, the contact angle becomes about 33°. When ozone treatment time is about 50 minutes, the contact angle becomes about 28°. That is, the introduction of the hydrophilic group causes the contact angle of the mold 70 to be about 25 to 35°.

That is, the surface of the mold 70 may be gradually replaced with the hydroxyl group (—OH) and the carboxyl group (—COOH) according to time of radiating ultraviolet rays or the ozone treatment. Therefore, it shows that the contact angle decreases because the surface of the mold 70 has a hydrophilic property.

Accordingly, when the ozone treatment is performed for about 10 minutes to 60 minutes, for example 30 minutes to 50 minutes, an appropriate amount of the hydrophilic group, such as the hydroxyl group (—OH) and the carboxyl group (—COOH), may be introduced onto the surface of the mold 70.

A PDMS-co-APMS surface treatment performed on the mold 70 will be described below with reference to FIG. 3A to FIG. 3E.

Figure 3A:
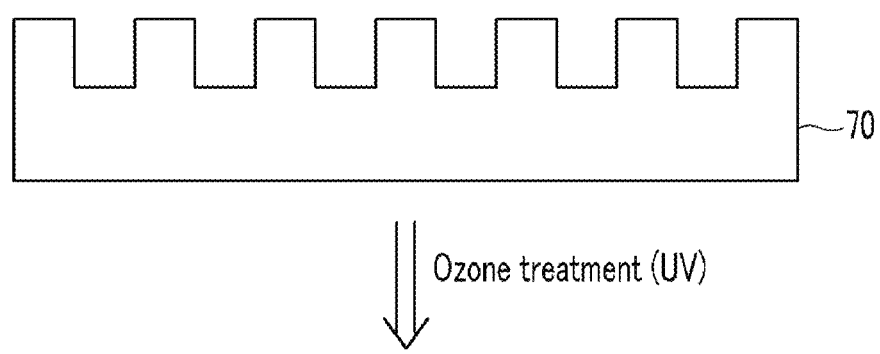
FIG. 3A, FIG. 3B, FIG. 3C, FIG. 3D, and FIG. 3E are cross-sectional views sequentially showing processing a mold used in an imprint apparatus with surface treatment according to an exemplary embodiment of the present invention.
Figure 3B:
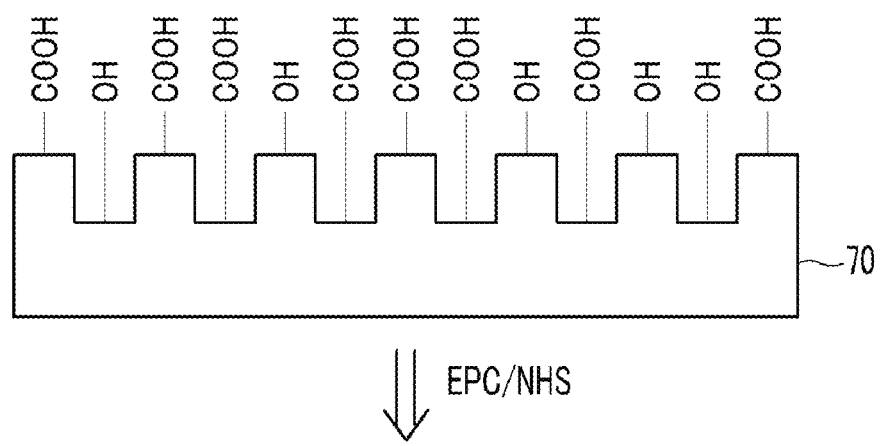
Figure 3C:
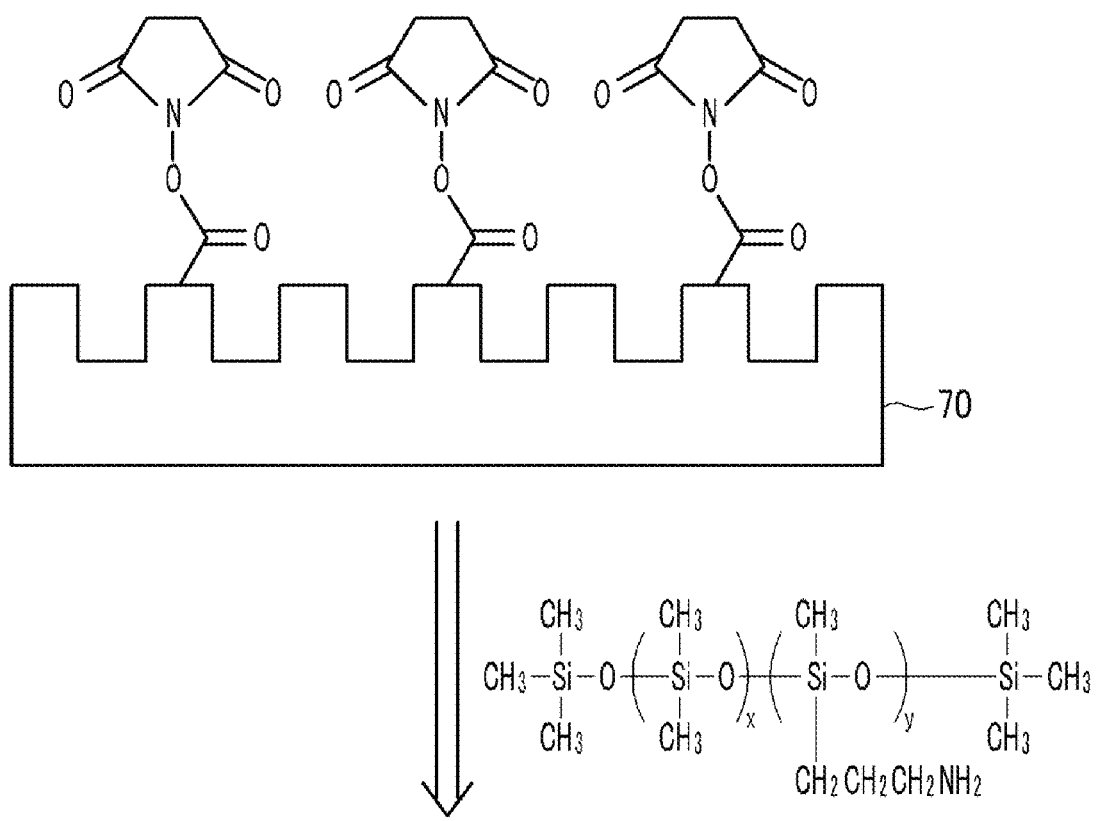
Figure 3D:
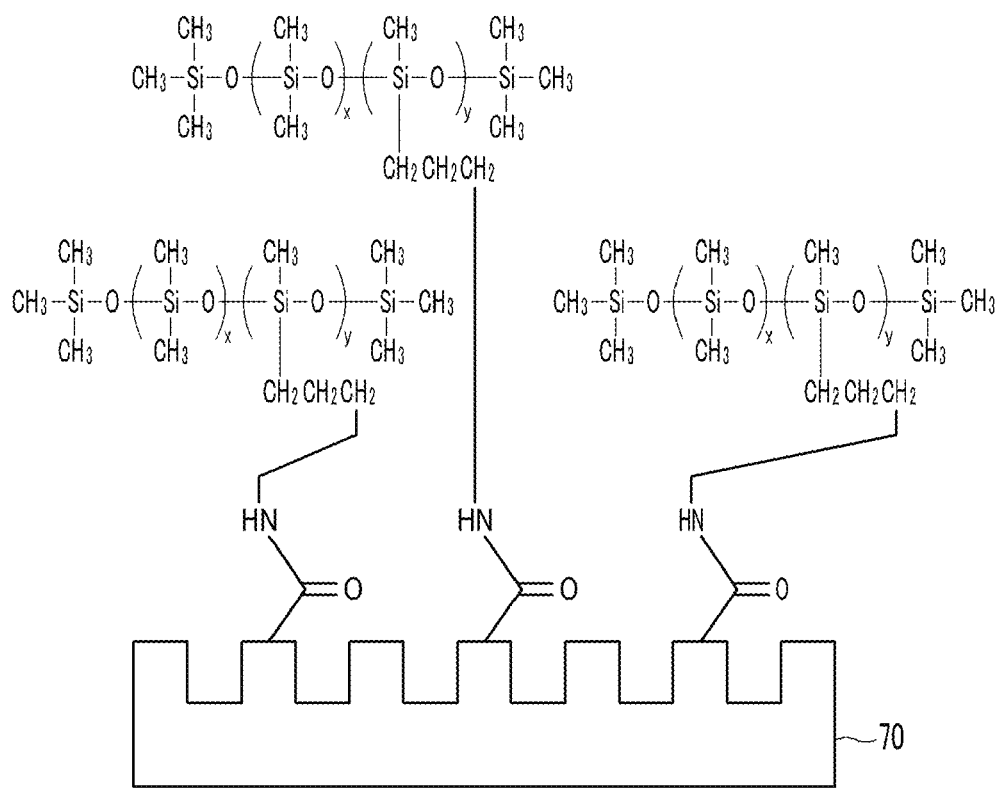
Figure 3E:
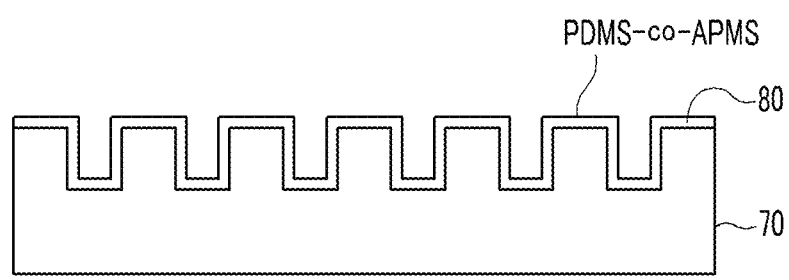

As shown in FIG. 3A and FIG. 3B, a hydrophilic group, such as the carboxyl group and the hydroxyl group, are introduced onto the surface of the mold 70 by ozone treatment. The carboxyl group reacts on the mixture of 1-[3-(dimethylamino)propyl]-3-ethyl carboimide hydrochloride (EDC) and N-hydrosuccinimide (NHS). For example, the mixture contains EDC and NHS in a mole ratio of 2:1. The reaction forms N-hydrosuccinimide esters as a reaction intermediate, as shown in FIG. 3C. Then, a compound including PDMS-co-APMS is formed by reacting the reaction intermediate with the amine group of PDMS-co-APMS, as shown in FIG. 3D. Finally, as shown in FIG. 3E, the polymer layer 80 having PDMS-co-APMS is formed on the surface of the mold 70 at a thickness of about 80 nanometers.

The PDMS-co-APMS surface treatment introduces the hydrophobic group onto the convex portion 71 and the recess portion 73 of the mold 70. The introduction of the hydrophobic group will be described with reference to FIG. 4, which is a graph that shows variation of a contact angle of a surface of the mold 70 according to PDMS-co-APMS surface treatment time and temperature.

Figure 4:
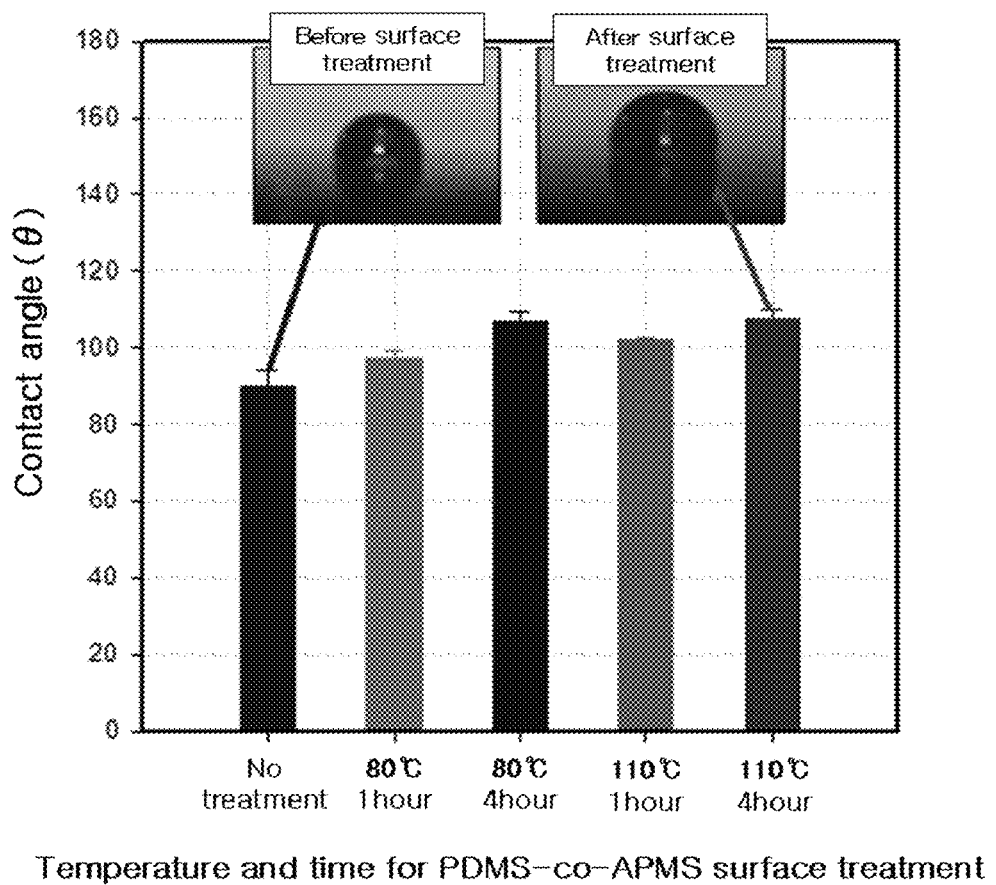
FIG. 4 is a graph that shows variation of a contact angle of a surface of a mold according to surface treatment time and temperature during surface treatment a mold used in an imprint device with PDMS-co-APMS according to an exemplary embodiment of the present invention.

Referring to FIG. 4, the contact angle may be 87° without any PDMS-co-APMS surface treatment. The contact angle becomes 97° when the PDMS-co-APMS surface treatment is performed for one hour at 80° C., the contact angle becomes 108° when the PDMS-co-APMS surface treatment is performed for four hours at 80° C., the contact angle becomes 103° when the PDMS-co-APMS surface treatment is performed for one hour at 110° C., and the contact angle becomes 109° when the PDMS-co-APMS surface treatment is performed for four hours at 110° C. That is, the contact angle of the mold 70 becomes about 95° to 110° by introducing the hydrophobic group through the PDMS-co-APMS surface treatment.

That is, the surface of the mold 70 is gradually replaced with PDMS-co-APMS having the hydrophobic property according to surface treatment time and temperature during the PDMS-co-APMS surface treatment. Accordingly, the contact angle of water becomes greater due to the hydrophobic property of the surface of the mold 70.

Here, the PDMS-co-APMS surface treatment may be performed for one hour to four hours at a temperature of about 80° C. to 130° C. An appropriate amount of PDMS-co-APMS, the hydrophobic compound, is introduced on the surface of the mold 70 by performing the PMDS-co-APMS surface treatment, for example at a temperature of about 105° C. to 115° C. As a result, a polymer layer 80 is formed.

When the mold 70 having the polymer layer 80 is used in a lithography process, the mold 70 can be easily separated from a resist layer after forming a desired pattern with less cost without increasing the number of manufacturing processes.

Also, because the mold 70 may be easily separated from the resist layer, the mold 70 may not require a process to clean un-separated portions of the resist layer from it, thereby increasing the mold's life span.

An exemplary embodiment of the present invention will be described below with reference to FIG. 5A to FIG. 5K.

Here, a method of forming a pattern using an imprint device having a mold 70 will be described. In this case, the mold 70 is coated with a polymer layer 80 through PDMS-co-APMS surface treatment.

As shown in FIG. 5A, a substrate 10, such as glass or plastic, is prepared. As shown in FIG. 5B, a base layer 20 is coated on the substrate 10. The base layer 20 may be a silicon layer. Alternatively, one of a metal layer having a silicon oxide layer and a silicon nitride layer, a metal oxide layer, and a metal nitride layer may be used instead of a silicon layer.

Then, as shown in FIG. 5C, a resist layer 40 is formed by coating a resist composition on the base layer 20.

Then, a polymer layer 80 is formed by performing poly (dimethylsiloxane-co-(aminopropyl)methylsiloxane) (PDMS-co-APMS) surface treatment on the convex portion 71 and the recess portion 73 of the mold 70. Here, the step of forming the polymer layer 80 by processing the mold 70 with the PDMS-co-APMS surface treatment can be performed any time before disposing the mold 70 over the resist layer 40.

Then, as shown in FIG. 5D, the mold 70 including the polymer layer 80 is disposed on the resist layer 40. Here, the mold 70 is required to be accurately disposed at a target location in order to form a pattern at a desired location.

Figure 5E:
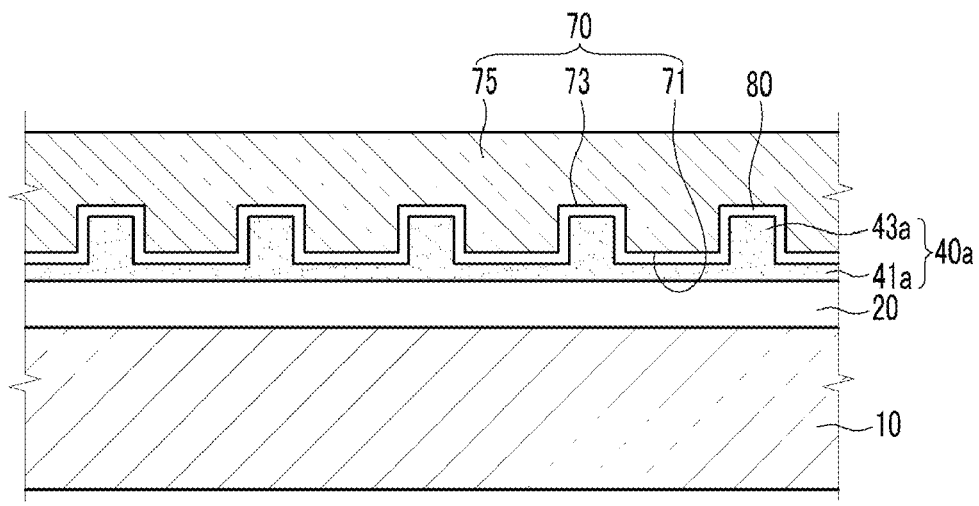

As shown in FIG. 5E, a pre-resist pattern 40a, which has a pattern portion 43a and a non-pattern portion 41a, is formed by imprinting the resist layer 40 using the mold 70.

Figure 5F:
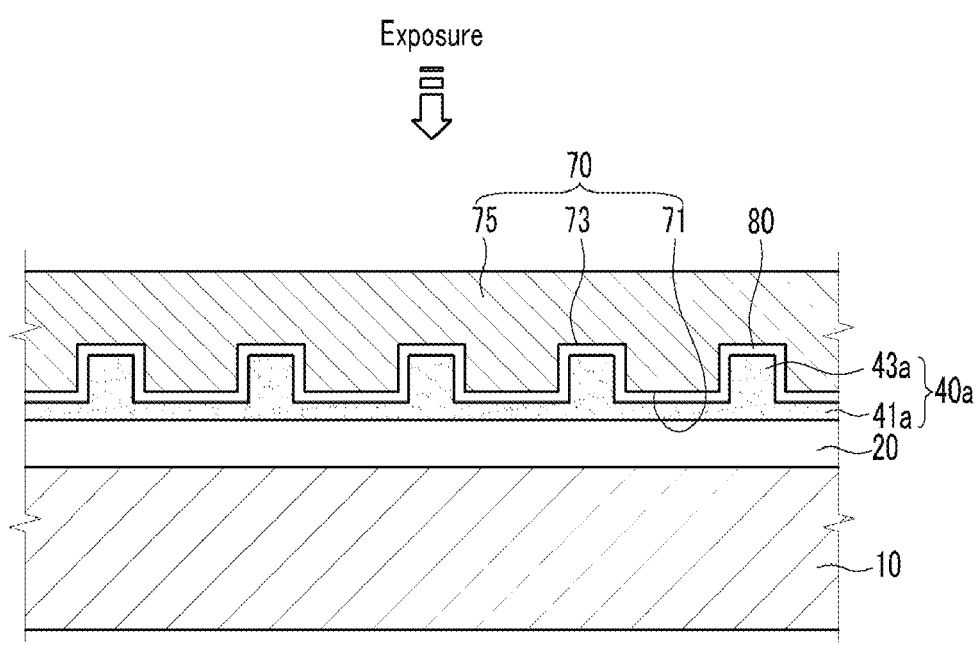
Figure 5G:
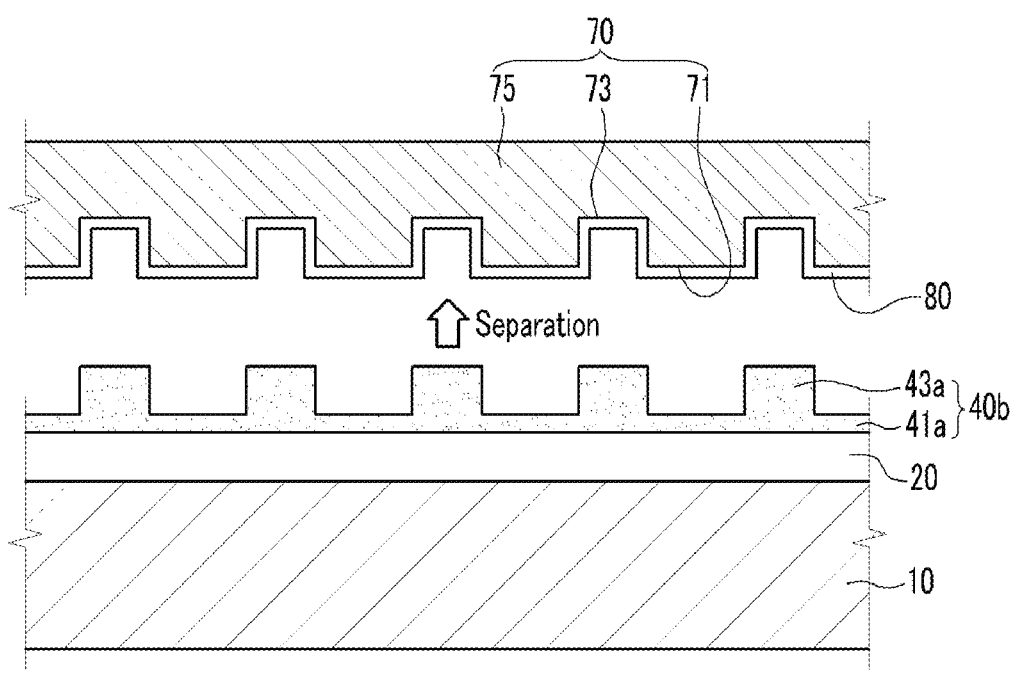
Figure 5H:
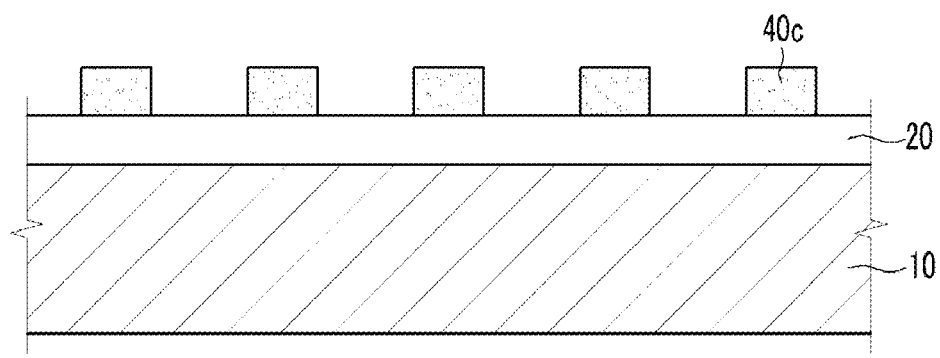

Then, as shown in FIG. 5F, a hardened resist pattern is formed by exposing the imprinted pre-resist pattern 40a for one minute and thirty seconds at a wavelength of 265 nm using a light exposer. As shown in FIG. 5G, the mold 70 is then separated from the hardened resist pattern 40b. Here, the PDMS-co-APMS treatment causes the surface of the mold 70 to have a hydrophobic property. Due to the hydrophobic property, the mold 70 may be easily separated from the hardened resist pattern 40b. As shown in FIG. 5H, a resist pattern 40c is formed by removing the unnecessary non-pattern portion 41a through ashing the hardened resist pattern 40b.

Figure 5I:
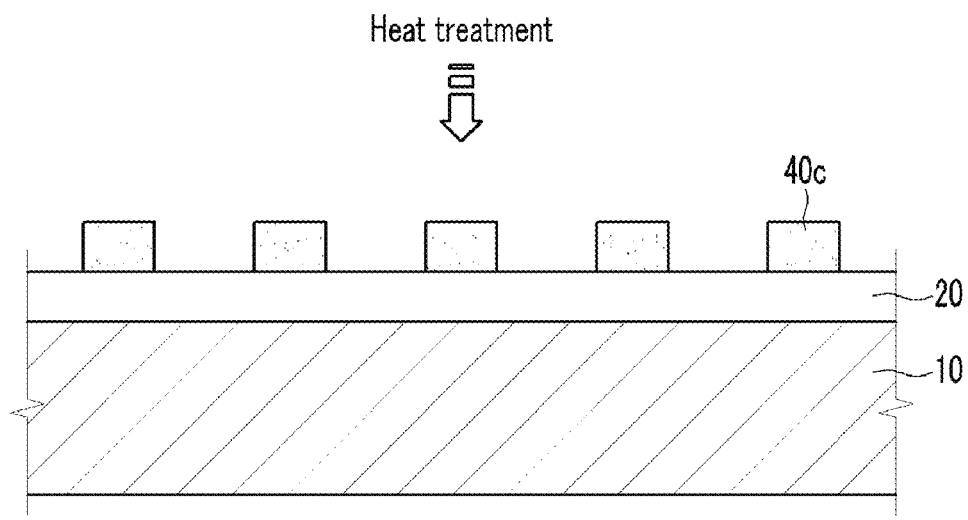

As shown in FIG. 5I, the adherence of a silicon layer used as the resist pattern 40c and the base layer 20 is enhanced and unnecessary solvent is evaporated by performing heat treatment on the resist pattern 40c in an oven for 45 minutes at a temperature of 225° C.

Figure 5J:
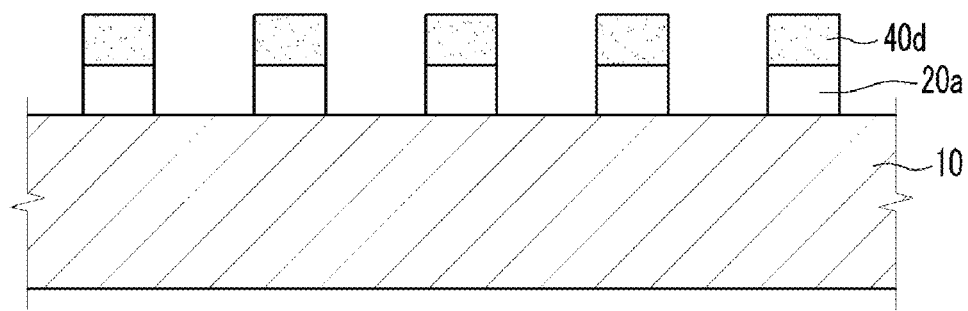

As shown in FIG. 5J, a predetermined pattern 20a is formed at the base layer by applying an etching process using the heat treated resist pattern 40d.

Figure 5K:
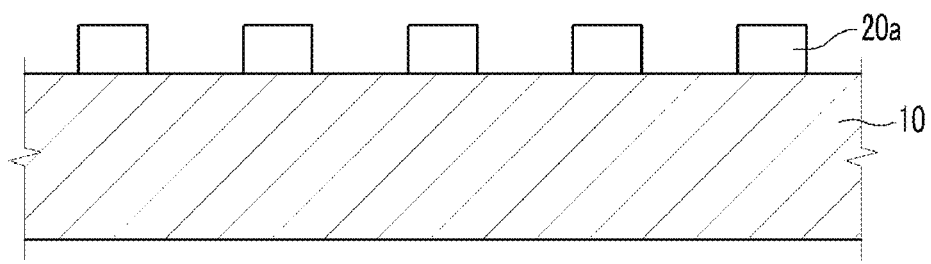

Finally, as shown in FIG. 5K, the resist pattern 40d is removed from the pattern 20a through stripping.

Figure 6:
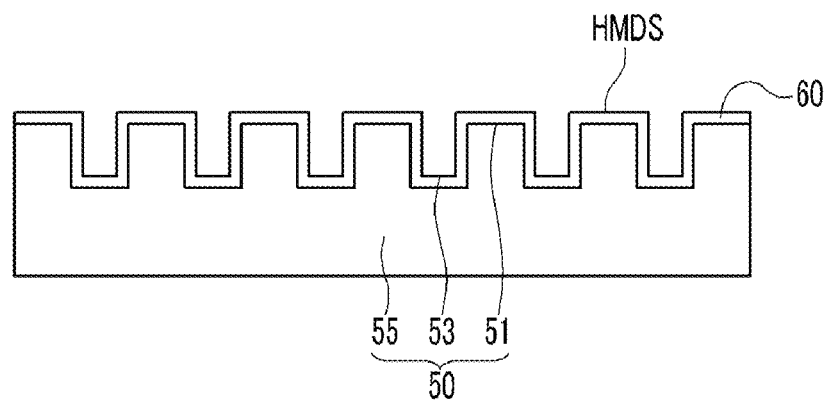
FIG. 6 is a cross-sectional view of a mold according to an exemplary embodiment of the present invention.

With reference to FIG. 6, a mold 50 according to another exemplary embodiment of the present invention will be described.

The mold 50 may include a surface having a convex portion 51 and a recess portion 53, a main body 55 made of a high molecular weight material, and a coating layer 60 made of a compound having a hydrophobic group on the main body 55. Here, the coating layer 60 may include hexamethyldisilazane (HMDS).

A hydroxyl group that is hydrophilic group is introduced onto the convex portion 51 and the recess portion 53 of the mold 50 by ozone treatment.

The introduction of the hydrophilic group will be described below with reference to FIG. 7, which is an FT-IR graph showing state variation of the hydroxyl group introduced onto the surface of the mold 50 according to ozone treatment time.

In a qualitative aspect, the hydroxyl group (—OH) has a characteristic peak that widely spreads at a wavelength of 3300-3500 ($cm^{-1}$). In a quantitative aspect, all of characteristic peaks of the hydroxyl group (—OH), the intensity of the absorbance unit, increase from a curve (A) of no ozone treatment, a curve (B) of 10 minutes of ozone treatment, a curve (C) of 30 minutes of ozone treatment, to a curve (D) of 50 minutes of ozone treatment. This means that the longer the ozone treatment time is, the more the hydroxyl group (—OH) is introduced onto the surface of the mold 50.

An HMDS surface treatment on the mold 50 will be described below with reference to FIG. 6 and FIG. 8A to FIG. 8C.

Figure 8A:
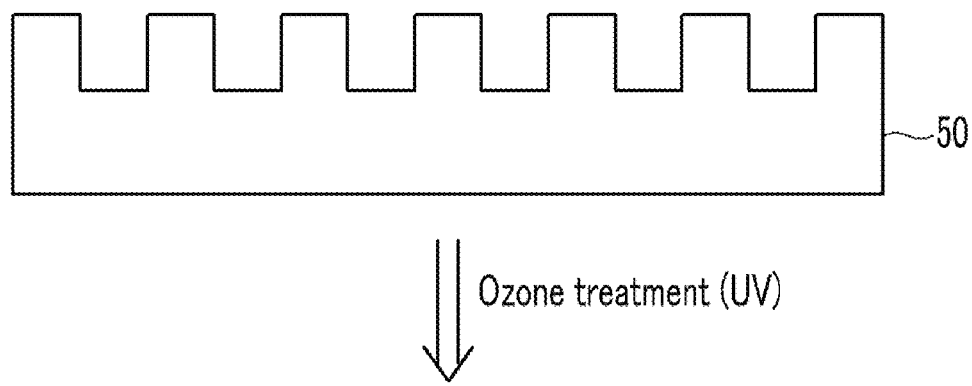
FIG. 8A, FIG. 8B, and FIG. 8C are cross-sectional views for sequentially showing processing a mold with surface treatment.
Figure 8B:
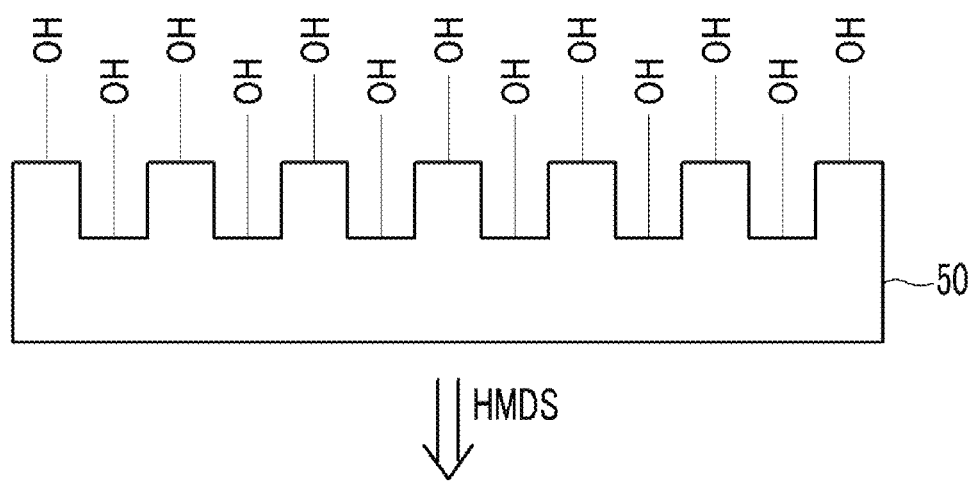
Figure 8C:
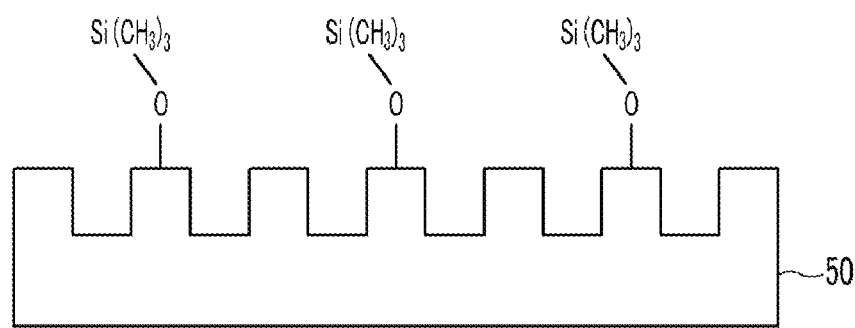

As shown in FIG. 8A and FIG. 8B, the hydroxyl group, which is a hydrophilic group, is introduced onto the surface of the mold 50 by processing the mold 50 with the ozone treatment. As shown in FIG. 8C, a compound having HMDS is formed on the surface of the mold 50 with the hydroxyl group, and is introduced by coating the HMDS on the surface of the mold 50 and reacting the HMDS with the surface of the mold 50 for about 15 minutes to 1 hour at room temperature. As a result, the coating layer 60 having the HMDS may be formed on the surface of the mold 50 at a thickness of several nanometers. Finally, unreacted material is removed from the surface of the mold 50 by cleaning the surface of the mold 50 using a solvent such as distilled water or isopropyl alcohol (IPA).

As described above, the HMDS surface treatment introduces the hydrophobic group onto the convex portion 51 and the recess portion 53 of the mold 50. Since the HMDS surface treatment introduces the hydrophobic group onto the surface of the mold 50 as described above, the mold 50 has low interface energy. Therefore, the mold 50 can be easily separated from a hardened resist pattern.

With reference to FIG. 9A to FIG. 9D, a method of processing a substrate 10 with a surface treatment according to an exemplary embodiment of the present invention will be described.

Figure 9A:
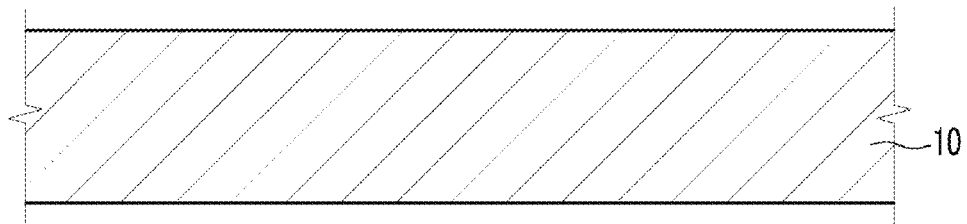
FIG. 9A, FIG. 9B, FIG. 9C, and FIG. 9D are cross-sectional views showing a substrate and a method of processing the substrate with surface treatment according to an exemplary embodiment of the present invention.
Figure 9B:
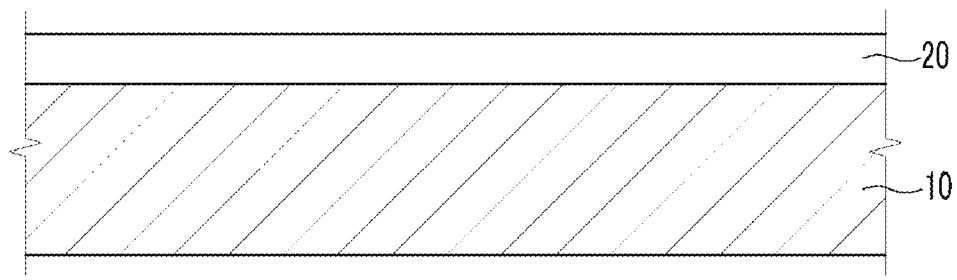

As shown in FIG. 9A and FIG. 9B, a base layer 20 is formed on a substrate 10, which may be made of glass or plastic. The base layer 20 is a thin film made of a material such as a metal, SiOx, and SiNx. Since various layers of electrodes used in real display devices are generally made of metal, SiOx, and SiNx, the base layer 20 is exemplary described to be made of these materials.

Figure 9C:
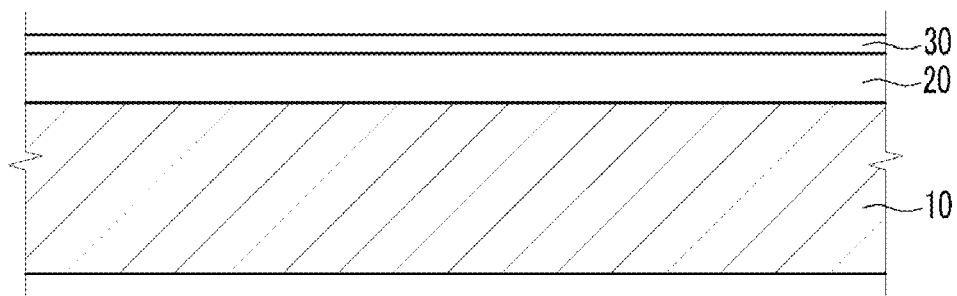

As shown in FIG. 9C, an adherence enhancing layer 30 is formed on the base layer 20 by coating a solvent containing a compound having a methyl group such as tetramethylammonium hydroxide (TMAH) at 0.3 wt % to 3 wt % on the base layer 20.

Figure 9D:
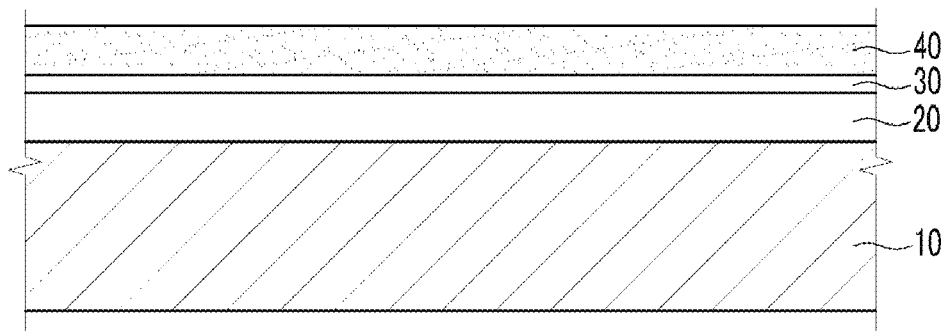

Then, as shown in FIG. 9D, a resist layer having a photo-crosslinker is coated on the adherence enhancing layer 30. Here, the resist layer 40 may be subsequently hardened by radiating light, thereby forming a hardened resist layer, as shown in FIG. 10C and FIG. 10D. The photo-crosslinker may include a polyfunctional group. Here, the resist layer 40 may further include at least one of a photo-initiator, an adhesion promoter, and a surfactant.

The adherence enhancing layer 30 is formed between the resist layer 40 and the base layer 20, which is made of a material used for various layers of electrodes in display devices, and may include TMAH. Therefore, the adherence enhancing layer 30 improves the adherence between the resist layer 40 and the base layer 20 on the substrate 10. Accordingly, it is possible to cause the resist layer 40 to more strongly adhere to the substrate 10 than to the mold 50 when separating the mold 50 from the resist layer 40 after imprinting the resist layer 40 using the mold 50. That is, since the contact angle of the TMAH-surface treated substrate 10 including the adherence enhancing layer 30 is about 15° to 35°, the surface of the substrate 10 has a comparatively hydrophilic property. Therefore, the substrate 10 has high interface energy. Therefore, the adherence between the substrate 10 and the hardened resist pattern 40b increases after the hardening process because an interface contact property between the liquid resist layer 40 and the substrate 10 is improved by the adherence enhancing layer 30. The surface of the mold 50 has comparative low interface energy between the mold 50 and the hardened resist pattern 40b because the surface of the mold 50 is treated through HMDS having the hydrophobic property. Consequently, the mold 50 can be easily separated from the hardened resist pattern 40b without increasing the number of manufacturing processes and with less cost after forming a desired pattern. Further, the hardened resist pattern 40b is prevented from being left on the surface of mold 50. Therefore, the process margin is improved and a high yield is expected. Also, the life span of the mold 50 is extended.

Hereinafter, a method for forming a thin film pattern on a substrate 10 using a mold 50 according to an exemplary embodiment of the present invention will be described with reference to FIG. 10A to FIG. 12.

In the present exemplary embodiment, a method of forming a pattern on a substrate 10 using a mold 50 having a coating layer 60 formed through a HMDS surface treatment will be described.

Figure 10A:
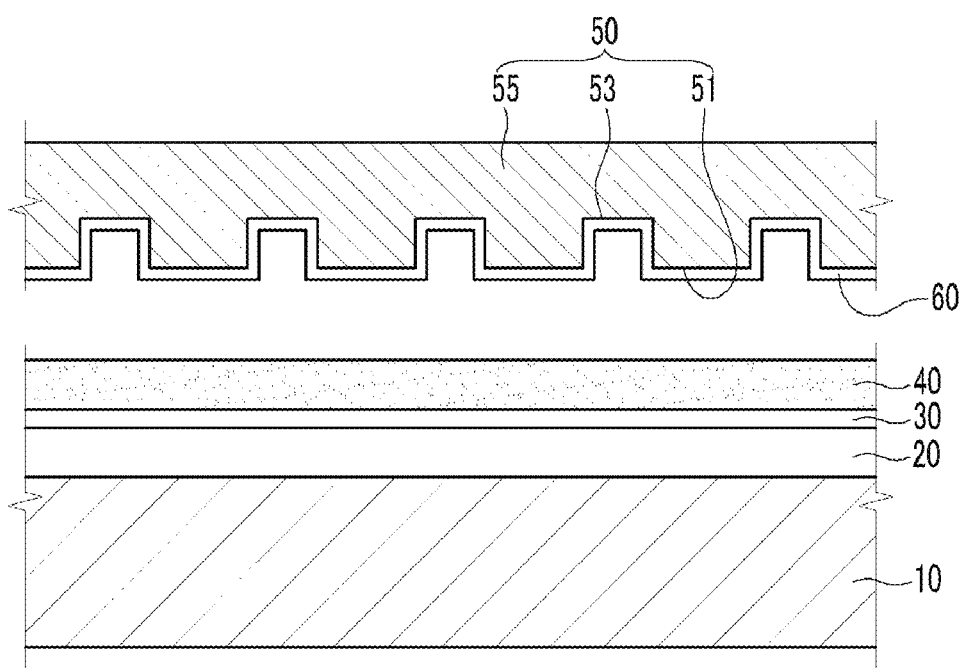
FIG. 10A, FIG. 10B, FIG. 10C, FIG. 10D, FIG. 10E, FIG. 10F, FIG. 10G, and FIG. 10H are cross-sectional views showing a method of forming patterns according to an exemplary embodiment of the present invention.

As shown in FIG. 10A, a substrate 10 having a base layer 20, an adherence enhancing layer 30 having TMAH, and a resist layer 40 is prepared.

Also, the mold 50 having a coating layer 60 formed through the HMDS surface treatment is prepared.

Here, the order of performing the HMDS surface treatment on the mold 50 and the TMAH surface treatment on the substrate 10 can be changed. Then, the mold 50 having the coating layer 60 is disposed on the resist layer 40. Here, the mold 50 should be accurately disposed at a target location in order to form a pattern at a desired location.

Figure 10B:
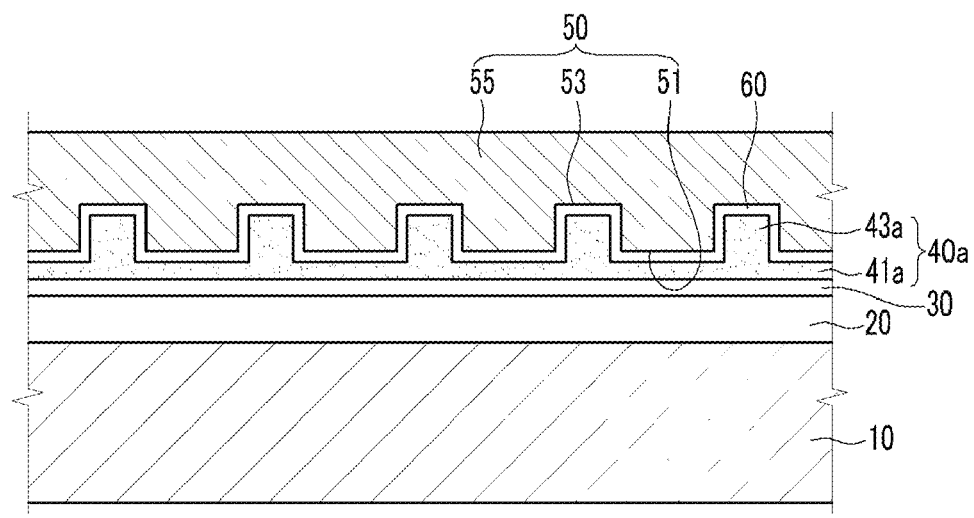
Figure 10C:
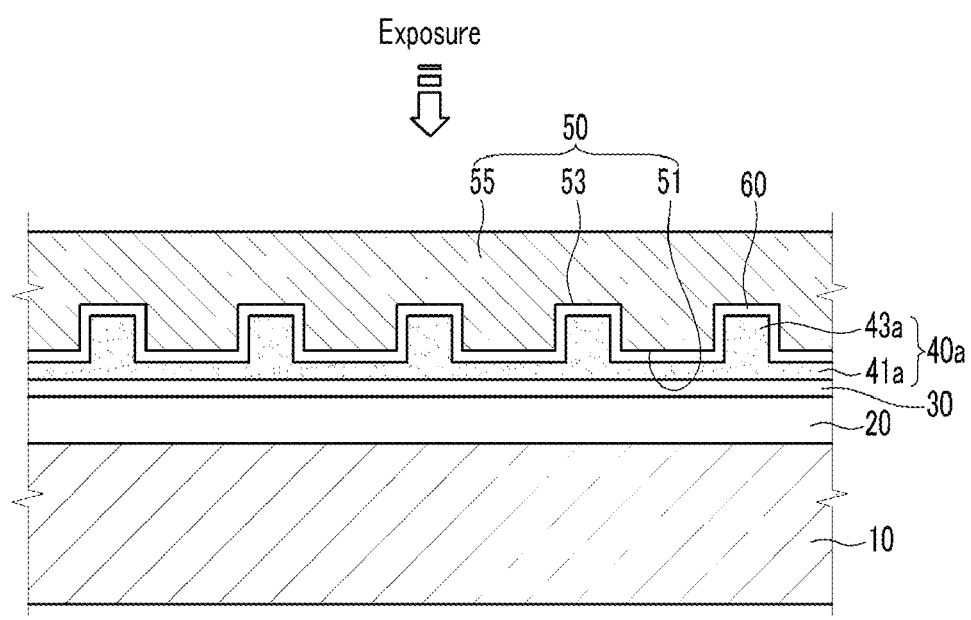
Figure 10D:
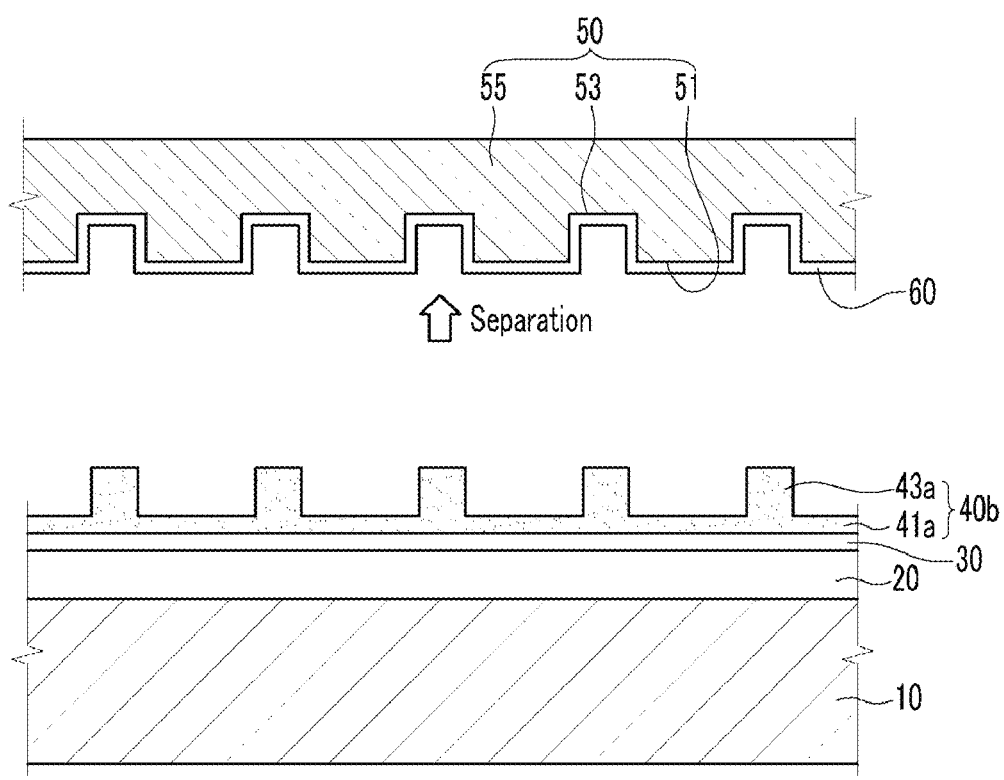

Then, as shown in FIG. 10B, a pre-resist pattern 40a, which has a pattern portion 43a and a non-pattern portion 41a, is formed by imprinting the resist layer 40 using the mold 50.

As shown in FIG. 10C and FIG. 10D, a hardened resist pattern 40b is formed by exposing the imprinted pre-resist pattern 40a for one minute thirty seconds with light having a wavelength of about 250 nm to 400 nm. Then, the mold 50 is separated from the hardened resist pattern 40b. Here, since the surface of the mold 50 has a hydrophobic property because the mold 50 is processed through the HMDS surface treatment, and the substrate 10 has a hydrophilic property due to the adherence enhancing layer 30, the hardened resist pattern 40b is left at the substrate 10 having high interface energy. Therefore, it is easy to separate the mold 50 from the hardened resist pattern 40b.

Figure 10E:
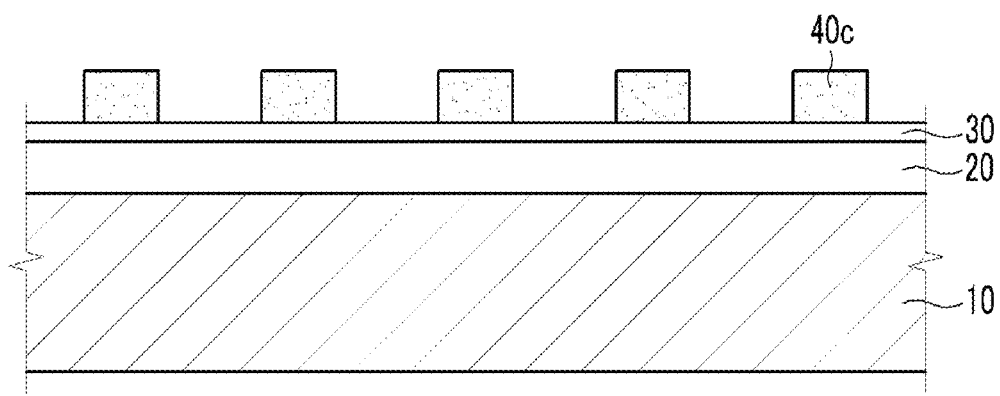
Figure 10F:
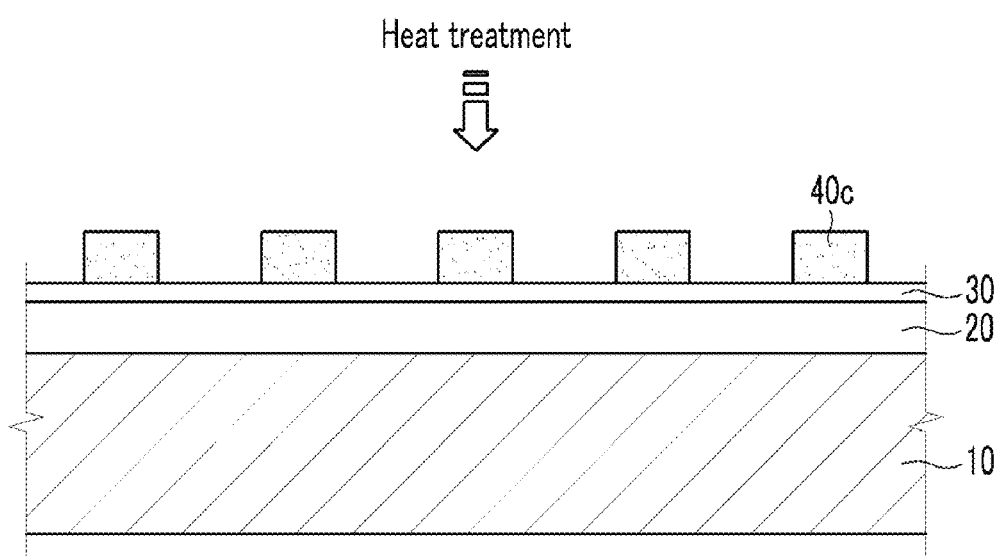

As shown in FIG. 10E and FIG. 10F, a resist pattern 40c is formed by removing the unnecessary non-pattern portion 41a through ashing the hardened resist pattern 40b.

Then, the adherence of the resist pattern 40c and the adherence enhancing layer 30 is improved and unnecessary solvent is evaporated by performing heat treatment on the resist pattern 40c in an oven for 45 minutes at a temperature of 225° C.

Figure 10G:
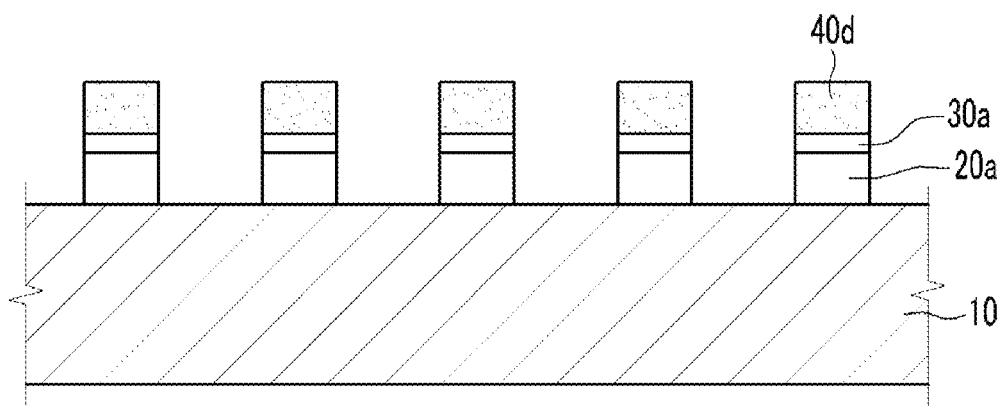

As shown in FIG. 10G, a predetermined pattern 20a is formed at the pattern forming region by applying an etching process using the heat treated resist pattern 40d. Here, the adherence enhancing layer 30 is also etched. That is, the remaining adherence enhancing layer 30a is formed with the same shape as the pattern 20a.

Figure 10H:
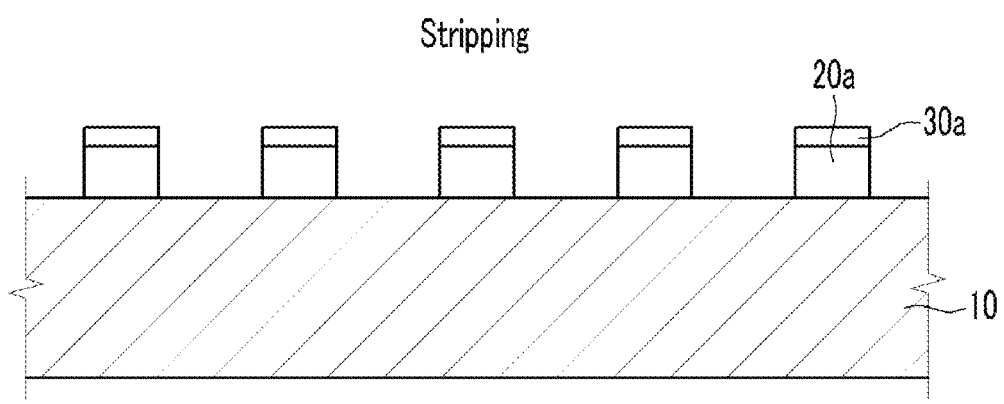

Then, as shown in FIG. 10H, the heat treated resist pattern 40d is removed from the pattern 20a through stripping. After removing the heat treated resist pattern 40d, the remaining adherence enhancing layer 30a may be left on the pattern 20a. Since the material of the remaining adherence enhancing layer 30a is a low molecular weight material and it does not react with the material of the base layer 20, it may be left on the pattern 20a.

A method of manufacturing a display device using a pattern forming method according to an exemplary embodiment of the present invention will now be described.

Figure 11:
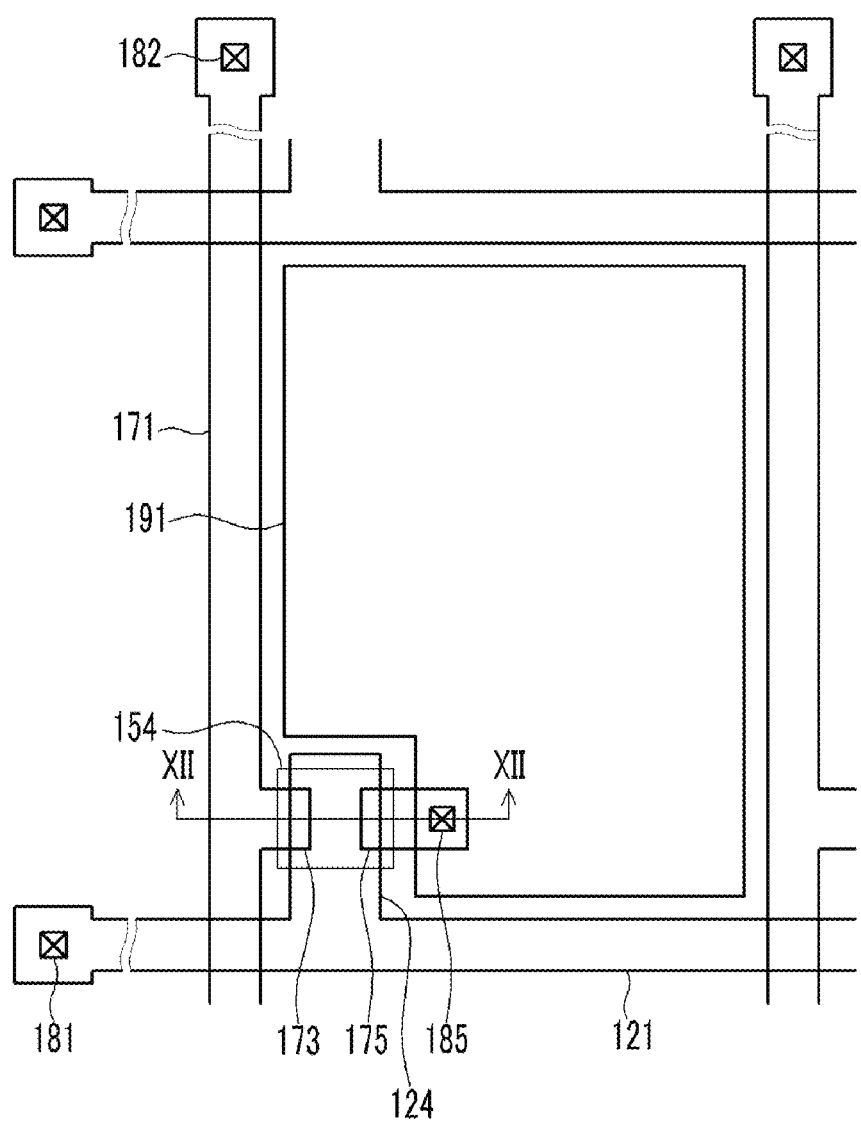
FIG. 11 is a layout view showing a thin film transistor array panel for a liquid crystal display according to an exemplary embodiment of the present invention.
Figure 12:
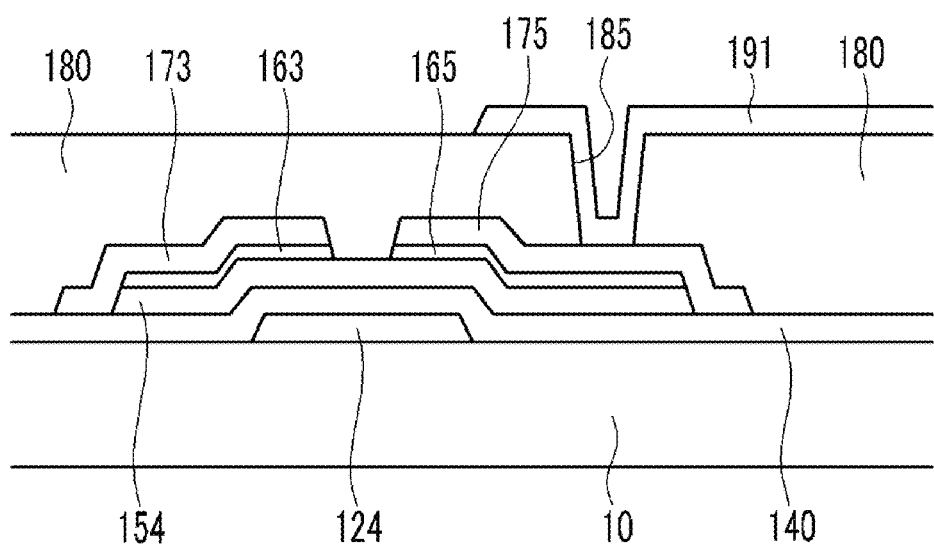
FIG. 12 is a cross-sectional view taken along line XII-XII of FIG. 11.

FIG. 11 is a layout view illustrating a structure of a thin film transistor array panel for a display device according to an exemplary embodiment of the present invention, and FIG. 12 is a cross-sectional view taken along line XII-XII of FIG. 11.

A plurality of gate lines 121, which transfer gate signals, are formed on a substrate 10. The plurality of gate lines 121 extend in a horizontal direction and portions of each gate line 121 form a plurality of gate electrodes 124.

A gate insulating layer 140 is formed over the gate lines 121. A semiconductor island layer 154 and ohmic contact layers 163 and 165 are formed over the gate insulating layer 140. A plurality of data lines 171 and a plurality of drain electrodes 175 are formed over the ohmic contact layers 163 and 165 and the gate insulating layer 140, respectively.

The plurality of data lines 171 extend in a vertical direction and cross the plurality of gate lines 121. The data lines 171 transfer data voltages. A plurality of branches extend from each data line 171 to form source electrodes 173. A pair of a source electrode 173 and a drain electrode 175 are separated from each other and disposed at opposite sides of the gate electrode 124.

A gate electrode 124, a source electrode 173, and a drain electrode 175 form a thin film transistor (TFT) together with the semiconductor island layer 154. The channel of the thin film transistor is formed in the semiconductor island layer 154 between the source electrode 173 and the drain electrode 175.

A passivation layer 180 having a contact hole 185 is formed over the data line 171 and the drain electrode 175, and a pixel electrode 191 is formed over the passivation layer 180.

In the thin film transistor array panel, at least one of the gate line 121, the gate insulating layer 140, the semiconductor layer 154, the data line 171 and drain electrode 175, the passivation layer 180, and the pixel electrode 191 can be formed through the described method of forming a pattern using a mold according to the present invention. Therefore, an adherence enhancing layer 30 having a compound containing a methyl group according to an exemplary embodiment of the present invention may be formed over at least one of these layers and with the same shape as the layer over which it is formed.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A mold, comprising:
   a main body having a convex portion and a recess portion; and
   a polymer layer disposed on the convex portion and the recess portion, the polymer layer having an amine group,
   wherein the polymer layer comprises a dimethylsiloxane and aminopropyl methylsiloxane copolymer (PDMS-co-APMS).

2. The mold of claim 1, wherein the polymer layer is formed by combining the amine group and N-hydrosuccinimide esters.

3. The mold of claim 1, wherein the polymer layer has a hydrophobic property at a surface of the polymer layer.

4. The mold of claim 3, wherein a contact angle of a surface of the polymer layer is about 95° to 110°.

5. A mold, comprising:
   a main body having a convex portion and a recess portion; and
   a polymer layer on the main body, the polymer layer having a hydrophobic property,
   wherein the polymer layer comprises a polymer/copolymer.

6. The mold of claim 5, wherein a contact angle of a surface of the polymer layer is about 95° to 110°.

7. The mold of claim 5, wherein the polymer/copolymer comprises a dimethylsiloxane and aminopropyl methylsiloxane copolymer (PDMS-co-APMS).

8. A method of forming a mold, comprising:
   forming a main body having a convex portion and a recess portion; and
   processing a surface of the main body with a high molecular weight material comprising an amine group.

9. The method of claim 8, wherein processing the surface of the main body with the high molecular weight material comprising the amine group comprises:
   forming a hydrophilic group on the surface of the main body;
   replacing the hydrophilic group with N-hydrosuccinimide esters; and
   reacting the N-hydrosuccinimide esters with the amine group of the high molecular weight material.

10. The method of claim 9, wherein the hydrophilic group is at least one selected from a carboxyl group and a hydroxyl group.

11. The method of claim 10, wherein, in forming the hydrophilic group on the surface of the main body,
   the surface of the main body is processed through ozone treatment or with ultraviolet rays.

12. The method of claim 11, wherein a contact angle of the surface of the main body having the hydrophilic property is about 25° to 35°.

13. The method of claim 11, wherein the ozone treatment is performed for about 10 minutes to 60 minutes.

14. The method of claim 9, wherein, in replacing the hydrophilic group with N-hydrosuccinimide esters,
   the carboxyl group reacts with a mixture of 1-[3-(dimethylamino)propyl]-3-ethyl carboimide hydrochloride (EDC) and N-hydrosuccinimide (NHS).

15. The method of claim 14, wherein the mixture contains the EDC and NHS in a mole ratio of 2:1.

16. The method of claim 9, wherein reacting the N-hydrosuccinimide esters with the amine group of the high molecular weight material is performed for about 1 hour to 4 hours at a temperature about 80° C. to 130° C.

17. A method of manufacturing a mold, comprising:
   forming a main body comprising a convex portion and a recess portion; and
   forming a polymer layer having a hydrophobic property on the main body,
   wherein the polymer layer comprises a polymer/copolymer having an amine group.

18. The method of claim 17, wherein forming the polymer layer comprises:
  forming a hydrophilic group on a surface of the main body;
  replacing the hydrophilic group with N-hydrosuccinimide esters; and
  reacting the N-hydrosuccinimide esters with the polymer/copolymer.

19. The method of claim 17, wherein the polymer/copolymer comprises a dimethylsiloxane and aminopropyl methylsiloxane copolymer (PDMS-co-APMS).

20. A method of forming a pattern, comprising:
  coating a pattern forming region on a substrate;
  forming a resist layer on the pattern forming region;
  forming a main body of a mold, the main body having a convex portion and a recess portion;
  performing surface treatment on a surface of the main body having the convex portion and the recess portion, the surface treatment being performed with a high molecular weight material having an amine group, the surface treatment imparting a hydrophobic property to the surface of the main body;
  disposing the mold over the resist layer;
  forming a pre-resist pattern having a non-pattern portion and a pattern portion by imprinting the resist layer using the mold;
  forming a hardened resist pattern by exposing the imprinted pre-resist pattern;
  separating the mold from the hardened resist pattern;
  forming a resist pattern by removing the non-pattern portion by ashing the hardened resist pattern;
  performing heat treatment on the resist pattern;
  forming a pattern at the pattern forming region by etching the resist pattern; and
  stripping the resist pattern.

21. The method of claim 20, wherein the high molecular weight material comprises a dimethylsiloxane and aminopropyl methylsiloxane copolymer (PDMS-co-APMS).

* * * * *